Figure 1:
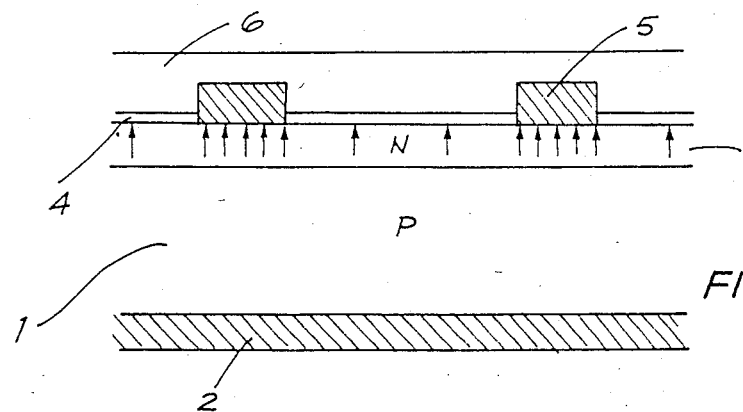

United States Patent [19]

Green et al.

[11] Patent Number: 4,589,191
[45] Date of Patent: May 20, 1986

[54] MANUFACTURE OF HIGH EFFICIENCY SOLAR CELLS

[75] Inventors: Martin A. Green, Waverley; Andrew W. Blakers, Campbell, both of Australia

[73] Assignee: Unisearch Limited, Kensington, Australia

[21] Appl. No.: 661,897

[22] Filed: Oct. 16, 1984

[30] Foreign Application Priority Data

Oct. 20, 1983 [AU] Australia .................... PG1952

[51] Int. Cl.⁴ ............................. H01L 31/18
[52] U.S. Cl. ........................... 29/572; 29/591;
427/74; 427/88; 136/255; 136/256; 357/30; 357/65
[58] Field of Search .............. 29/572, 591; 136/255, 136/256, 262; 427/74, 88, 89; 357/30, 65, 71

[56] References Cited

U.S. PATENT DOCUMENTS

| 3,982,964 | 9/1976 | Lindmayer et al. | 136/256 |
| 4,248,675 | 2/1981 | Bozler et al. | 204/38 A |
| 4,253,881 | 3/1981 | Hezel | 136/256 |
| 4,395,583 | 7/1983 | Meulenberg, Jr. | 136/256 |

Primary Examiner—Aaron Weisstuch

[57] ABSTRACT

A Passivated Emitter Solar Cell (PESC) with reduced surface recombination due to reduced contact area between the top metal contact and the top surface of the cell, and having an open circuit voltage approaching 700 mV and an energy conversion efficiency in excess of 19% is disclosed. The reduced contact area is obtained by a technique which simultaneously defines the lateral geometry of the top metal contact while allowing the top metal contact to be of much larger area than the area of contact to the top surface of the cell. Also disclosed are methods of manufacture of solar cells having an increased open cell voltage obtained by improved passivation of the cell surface obtained by this technique.

11 Claims, 5 Drawing Figures

MANUFACTURE OF HIGH EFFICIENCY SOLAR CELLS

The present invention relates to the manufacture of high efficiency solar cells, and to solar cells produced thereby.

To improve the energy conversion efficiency of solar cells it is necessary to increase the open circuit voltage. Recombination along the surfaces of the cell, particularly at the metal contacts to the cell, places an upper limit on this voltage with present technology. Two ways to reduce contact recombination are to use metal-thin insulator-semiconductor (MIS) or related contacts, or to reduce contact area to a minimum. These may be used in a complementary fashion.

To produce a high voltage silicon solar cell, recombination throughout the cell must be minimized to reduce the cell dark saturation current density. It has become clear over recent years that it is possible to specify substrate properties so that recombination rates in this region do not dominate cell performance. This leaves recombination in the thin emitter and back surface field regions and at the cell surface as the open circuit voltage determining mechanisms.

It is an object of the present invention to provide a new method of fabricating solar cells which effectively minimises contact area to the top and/or back surface(s) without sacrificing other properties of the contact, in particular the presence of adequate areas for bonding external contacts and the maintaining of a large cross-sectional area of the contact for lateral current flow.

It is another object of the invention to provide a Passivated Emitter Solar Cell (PESC) with reduced surface recombination due to reduced contact area obtained by the methods herein disclosed.

According to one aspect of the invention there is provided a solar cell comprising a body of semiconductor material having top and bottom metal contact layers, said body having two regions of different conductivity type forming a junction therebetween, one being a lower region containing a dopant of one conductivity type in contact with the bottom metal contact layer and the other being an upper region containing a dopant of the opposite conductivity type to that of said lower region, said upper region being separated from said top metal contact layer by a thin insulating layer except for areas where there are holes in the thin insulating layer, said holes defining the lateral extent of said top metal contact layer by the initial deposition of metal contacting directly to said upper region of the body of semiconductor material in the region of said holes, said top metal contact subsequently being built up by the deposition of metal adhering only in the region of said holes but being of sufficient thickness to cause said top contact to overlap between said holes whereby said top metal contact provides a large cross-sectional area of metallic contact on the top surface of the cell relative to the limited area of direct contact between the top metal contact and the body of semiconductor material.

In some forms of solar cells made according to the invention the lower region of the semiconductor is doped with a P-type impurity and the upper region is doped with an N-type impurity. In other forms of solar cells according to the invention the reverse applies, with the lower region doped with an N-type impurity and the upper region doped with a P-type impurity.

The metal contact layers are normally comprised of one or more metals selected from the group consisting of Ag, Al, Ca, Cu, Hf, In, Mg, Mn, Ni, Pb, Pd, Sc, Sn, Ti, Y, and Zr.

In some embodiments of solar cells according to the invention, the regions of differing conductivity type and the contacts thereto both lie interleaved on the same side of the body of semiconductor.

The invention is applicable to cells of any geometry, including cells with both contacts made to rear surfaces. The invention is also applicable to reducing contact area at the rear contact to the cell by separating it from the semiconductor body by an insulating layer and defining the rear contact geometry by contact holes or slots according to the teachings of the invention.

According to another aspect of the present invention there is provided a method of fabricating high efficiency solar cells wherein the actual area of the top metal contact is maximized for minimal contact of said metal contact with the cell—i.e., the actual area at which the top contact actually touches the cell is minimized, and differs appreciably from the total area of the metal contact layer.

According to the invention, significant differences in these values can be obtained in a simple, practical sequence. The top contact of a cell has to serve three purposes: (1) to contact the cell; (2) to provide an area to which external connections to the cell can be bonded; and (3) to provide a low resistance path from the points of contact with the cell to the bonding areas. According to the present invention, these requirements can be optimised individually.

In P-N and MIS solar cell structures ideally the top surface of the cell is well passivated to maximize the performance of the cell in terms of voltage and current output. The effects of contacts to the top surface upon surface passivation can be minimised if the contact area is minimised.

The method used according to the present invention provides solar cells having top metallic contacts which present a relatively large cross-section of conductor material to carry the current, but at the same time having a small contact area—either directly by interfacial contact, or indirectly by the tunneling of carriers through an intervening thin oxide layer—with the silicon substrate wafer.

Figure 2:
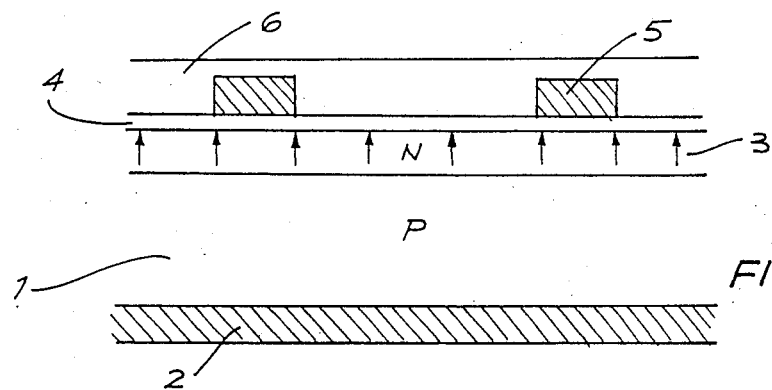
Figure 3:
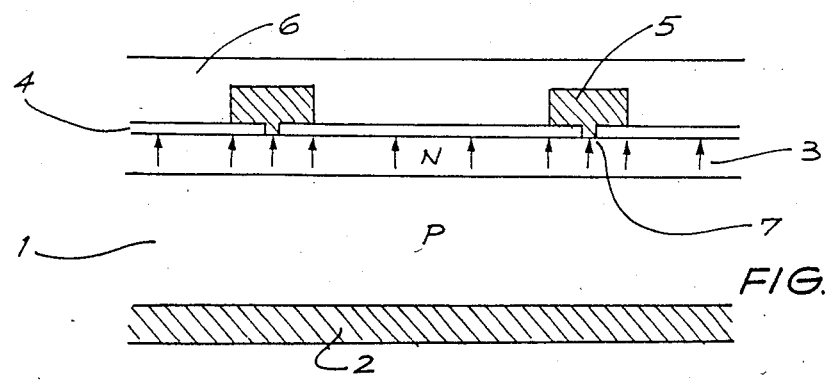
Figure 4:
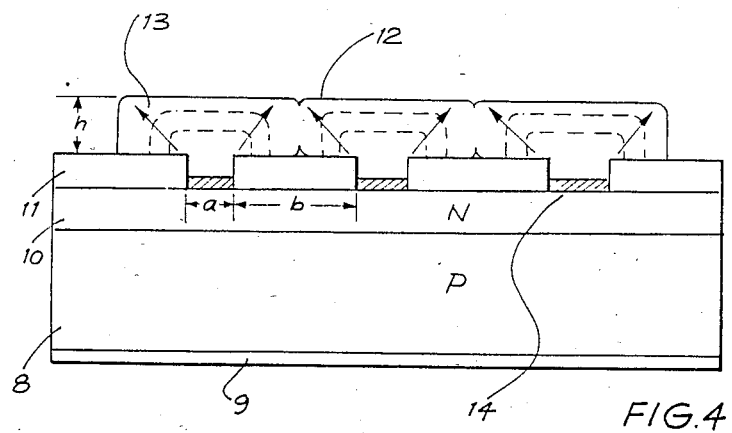
Figure 5:
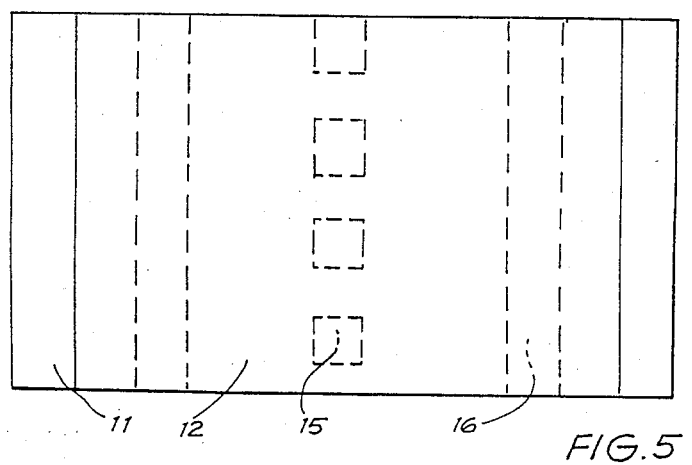

The invention will be further described with reference to the drawings, in which:

FIG. 1 schematically illustrates a cross-sectioned side elevational view of a conventional high efficiency PN solar cell structure;

FIG. 2 schematically illustrates another cross-sectional side elevational view of an improved metal-insulator-NP junction (MINP) cell with oxide passivation along the entire cell surface;

FIG. 3 schematically illustrates a further cross-sectional side elevation view of a Passivated Emitter Solar Cell (PESC) prepared according to the present invention, with reduced surface recombination due to the reduced contact area;

FIG. 4 schematically illustrates yet another cross-sectioned side elevational view of a passivated solar cell as manufactured according to the invention, and indicating the small contact areas with the cell; and FIG. 5 illustrates a top plan view of the solar cell of FIG. 4.

Referring to FIGS. 1 to 3, the cell structures comprise a silicon substrate of one dopant type 1 with a layer of different dopant type 3, a thin SiO$_2$ insulating layer 4, a bottom or rear metal contact 2, top metal grid contacts 5, and an anti-reflection coating 6. The small metal contact area 7 of the PESC device is shown in FIG. 3. The arrows in the N-layer indicate relative surface recombination rates.

Recombination within the emitter region can be reduced to low values by making this region very thin. The cell open circuit voltage will then be determined by recombination along the top surface of the cell as indicated by the arrows in FIG. 1.

Recombination rates in unmetallized regions of the top surface can be reduced to low values by appropriate passivation, such as by growing a thin thermal oxide 4 along it prior to the deposition of the antireflection coating 6. However, this does not reduce recombination in areas where metallic contact is made to the emitter. As indicated by the arrows in FIG. 1, these areas will remain regions of high recombination. As recombination in the other areas mentioned is minimized, recombination at the top contacts 5 to the cell will limit the cell open circuit voltage.

According to the present invention there is provided a number of methods which allow contact recombination rates to be suppressed and controlled. The methods developed according to the present invention are capable of producing cells of open circuit voltage of about 700 mV or higher.

One method of suppressing contact recombination uses the MINP structure of FIG. 2, which was developed by the inventors of the present invention (see U.S. Pat. No. 4,404,422). According to this method, the thin passivating oxide layer 4 of FIG. 1 is essentially continued on under the top contacts 5 (FIG. 2), greatly reducing contact recombination rates while allowing current transport by quantum mechanical tunneling through the oxide layer 4.

According to this method, the oxide layer 4 separating the metal contact 5 from the silicon 3 has a thickness usually no more than about 20–30 Angstroms to ensure an adequate tunneling rate of electrons.

According to this method, the inventors have obtained silicon cell open circuit voltages as high as 694 mV (AMO, 25° C.) while an energy conversion efficiency of 18.7% has been independently measured for such devices by the Solar Energy Research Institute (SERI) under standard terrestrial test conditions (as outlined in 'Terrestrial Photovoltaic Measurement Procedures', Report ERDA/NASA/1022/77/16, June, 1977).

Another method of reducing the effect of the contact is by reducing its contact area, as shown in FIG. 3. Such an approach provides emitter passivation comparable to that provided by the MINP approach when fabrication is effected as herein described. We refer to cells made in the way described herein as passivated emitter solar cells (PESC cells) to distinguish them from the MINP devices. It has been found possible to fabricate PESC cells in fewer processing steps than required for MINP devices of comparable efficiency.

In the PESC cell approach, the actual contact area of the top metallization is kept to very low values. As indicated in FIG. 3, the passivating oxide can be used to isolate the main body of the top metallization from the substrate. This approach provides a level of emitter passivation comparable to that provided by the MINP approach. However, it has the advantage that a self-aligned sequence can be used to define the areas of electrical contact and the top metallization pattern.

With this approach, an open circuit voltage of 687 mV (AMO, 25° C.) has been independently measured by NASA-Lewis Research Center for PESC devices fabricated on 0.1Ω cm substrates. An energy conversion efficiency 19.1% has been subsequently measured by SERI for a PESC cell fabricated on a 0.2Ω cm substrate under standard terrestrial test conditions (AMI.5, 100 mW/cm$^2$, 28° C.).

Although both MINP and PESC approaches have been shown to be capable of giving similar voltages and efficiencies, the PESC method is preferred because of its simpler processing sequence, as outlined below.

FIGS. 4 and 5 schematically represent a cross-sectional elevational view and a top plan view, respectively, of a solar cell manufactured according to the present invention, comprising a silicon substrate of one dopant type 8 with a layer of a different dopant type 10, a thin insulating layer or anti-reflection coating 11, a rear contact 9 and a top electroplated metal contact 12 (e.g. Cu, Ag) growing in the direction indicated by arrows 13. Contact of the top contacts 12 with the cell is through small contact areas 14, which can be either thin lines or slots 16 or a row of a plurality of spaced apart holes or wells 15 making contact between the bulk of the metallic contact 12 on top of the cell and the silicon substrate through the intervening insulator layer or antireflection coating 11. The metallic contat 12 is built up by known metal plating techniques, where lateral spreading of the deposited metallic contact (as at 13) on top of the antireflection coating or other insulator layer is utilized to advantage by allowing adjacent plating fronts to combine or merge to provide a large cross-section of metallic contact 12 on the top surface of the cell. Alternatively, the top metallic contact can be built up by other techniques, such as solder dipping, with similar results.

Referring to FIGS. 4 and 5 the dimensions a, b, and h are related.

The invention will be further described with reference to several non-limiting embodiments or processing sequences according to the invention.

In a first processing sequence according to the invention, a P-N junction is formed e.g., by diffusion, implantation or epitaxial growth—on a suitable silicon wafer substrate, followed by the formation of the rear contact at this stage or later, and followed further by depositing or growing an insulating layer on the top surface of the cell (i.e. a layer of SiO$_2$ about 100 Angstroms in thickness or an antireflection coating of about 800 Angstroms thickness).

Next the photosensitive layer is deposited on the top surface—masked as appropriate, and then exposed to light. The photosensitive layer is used to define those areas required to be subsequently etched through the insulator to the silicon substrate—i.e. to define the small contact areas for the metallic contacts.

The required contact metal (e.g., Ti/Pd or Ti/Ni or Ti/Pd/Ag or Ti/Pd/Cu or Ti/Ni/Cu) is deposited in the slots or holes formed as a result of the previous etching step, followed by removal or lift off of excess metal deposited onto the insulator or photoresist layer.

Finally, additional contact metal (e.g., Ag or Cu) is deposited or plated onto the top of the cell by standard plating techniques, where lateral spreading of the plated metal and the merging of adjacent contacts—normally a problem to be avoided in conventional cell manufacturing techniques—is actually desirable according to the process of the present invention. Alternatively, the additional contact metal could be built up by another technique, such as solder dipping.

According to a second processing sequence according to the invention, a P-N junction is formed and a layer of insulating material is grown or deposited on the top surface of the cell (e.g., $SiO_2$ about 100 Angstroms thick, or an antireflection coating of about 800 Angstroms thickness). Holes or slots provided in this layer are formed by normal photolithographic or other known sequences.

The required contact metal (e.g. Ni) is then plated onto the areas of silicon not covered by the insulating layer (including the rear of the cell if the rear contact is not applied by another technique). Finally, additional contact metal is applied by solder dipping. Alternatively, the additional contact metal can be applied by another technique, such as electroplating.

According to a third processing sequence according to the invention the metallic contacts are formed on a cell which maintains intact a thin oxide layer between the P-N substrate and the top metal contacts (i.e., a MINP cell) sufficiently thin (e.g. about 20 Angstroms) to allow tunnelling between the top metal contacts and the substrate.

As in the first sequence, a P-N junction is formed and the rear contact layer is formed at this stage or subsequently. A thin oxide layer (20 Angstroms) is thermally grown or deposited on the top and a photo-resist layer is further deposited on top of the oxide layer. The photo-resist layer is marked or patterned as required, by exposing to light as appropriate.

Next a further two layers are deposited on top of the structure, first an antireflection coating and second a temporary layer (e.g., magnesium metal or a suitable organic material). These layers are then patterned by removal or lift off of regions overlying the patterned photo-resist layer.

Following this a thin metal layer (3 layers of metal) is deposited. The contact metallization is lifted off where required using the temporary layer. In the present embodiment this is achieved by etching away the magnesium metal layer by exposure to hydrochloric acid; any materials which were previously deposited on top of the magnesium layer tend to slough off during this etching process.

The structure is then plated or solder dipped as described above with reference to the first sequence.

Because of the extra processing steps required in the third processing sequence compared to the first processing sequence, the first and second sequences are preferred for commercial processing to manufacture cells according to the invention.

According to a fourth processing sequence according to the invention, a P-N junction is formed on a suitable silicon wafer substrate, and the rear contacts are formed at this stage or later, as described above. Next a thin oxide layer (20 Angstroms) is deposited on top of the structure with an antireflection coating deposited on top of the oxide layer. The antireflection material used in this sequence is a material which can be etched away where required by suitable etching reagents which do not attack the thin oxide layer. The remainder of the steps in this sequence are as described above for the first sequence.

TABLE 1

| Cell No. | $V_{oc}$ (mV) | $J_{sc}$ (mA cm$^{-2}$) | $V_{mp}$ (mV) | $J_{mp}$ (mA cm$^{-2}$) | Fill factor (%) | Efficiency (%) |
|---|---|---|---|---|---|---|
| 13BB | 652 | 36.3 | 559 | 33.9 | 80.2 | 19.0 |
| 13AA | 650 | 36.2 | 555 | 33.9 | 80.0 | 18.8 |
| 176 | 653 | 36.0 | 562 | 33.9 | 81.1 | 19.1 |
| 177 | 653 | 36.0 | 556 | 34.2 | 80.8 | 19.0 |

Table I shows the important performance parameters of four high performance PESC cells fabricated according to the first sequence, above, as measured by the Solar Energy Research Institute (SERI), Colorado, under standard terrestrial test conditions (AM1.5, 100 mW/cm$^2$, 28° C.). The cells differed primarly in their diffusion conditions. The diffused layer sheet resistivity decreases from cell 13BB to cells 176 and 177 with that of 13BB lying near the top of the targeted range and that of 177 lying near the bottom. All cells displayed similar characteristics with about 1% spread or less in any one parameter. There was a possible trend to higher current densities at the lighter diffusions and also to lower fill factors and slightly lower voltages. The higher current densities could be explained by slightly better blue response, the lower fill factors by higher emitter lateral series resistance losses, and the lower voltages by marginally poorer surface passivation due possibly to a surface doping concentration lower than optimum. A value of $2-3 \times 10^{20}$cm$^{-3}$ is presently thought to be optimum for these devices.

The open circuit voltage of 653 mV for the highest efficiency cell in this group is excellent for a 0.2-$\Omega$cm substrate. It is determined almost entirely by the bulk silicon properties, with surface recombination having minimal effect. The short circuit current density of 36.0 mA/cm$^2$ is close to the highest ever measured by SERI for a silicon cell under standard test conditions[2] (cell 13BB with a value of 36.3 mA/cm$^2$ is reported to hold this distinction). It is a result of the excellent antireflection properties of the double layer coating and the low contact shading losses of 3.0%-3.5%. The high fill factor of 0.811 is a result of the high open circuit voltage, a cell ideality factor near unity ($\sim$1.05), and low parasitic shunt and series resistances due to good edge junction isolation and top contact design.

The substrates used in the particular embodiments of the invention as exemplified herein have been boron doped low resistivity float zone silicon. Highest efficiencies to date have been obtained on 0.2$\Omega$ cm material while highest open circuit voltages have been obtained on 0.1$\Omega$ cm material.

The devices described herein were diffused with phosphorus at temperatures in the range of 800°-950° C. The thin passivating oxide, nominally 10 nm thick, was grown in dry oxygen at temperatures in the range 800°-850° C. Contact slots 5 $\mu$m wide and thin Ti/Pd contact fingers of the same width were formed using the self-aligned photolithographic technique previously described. in this approach, the photoresist layer which masked against oxide etching was also used to define the finger pattern by a "lift-off" process. Ag was then plated to the fingers to a thickness of 8 $\mu$m. Total top contact coverage lay in the 3.0%-3.5% range. While using the technique herein described actual contact area was less than 1%. The cells were then laser scribed to a nominal 2$\times$2 cm size. Finally, a double layer antireflection coating of ZnS and MgF$_2$ was then deposited, optimized to take account of the 10-nmSiO$_2$ layer.

Solar cells produced according to the process of the present invention exhibit superior energy conversion efficiency when compared to cells of similar type produced according to previously known processes. Prototype cells produced according to the teachings of the present invention have given efficiency values of 19.1% (AMI, 28° C.) on a total area basis, compared to 17-18% for cells produced according to a prior art process. The efficiency of the cell is the ratio of electrical power output to the power in the incident sunlight or other incident light source.

The advance over the prior art made by the present invention is perhaps that the key to producing a 20% efficient silicon cell is to increase the open circuit voltage. An open circuit voltage of about 660 mV seems to be a minimum prerequisite in this regard.

Further optimization of diffusion conditions, optical coupling, top contact design, and edge junction isolation is expected to result in cells with efficiencies in the 19.5%-20% range. Additional improvements in the performance of cells of this resistivity beyond this range are dependent upon increases in minority-carrier lifetimes from their present value of 20-25 $\mu$s. Doubling such lifetimes will produce an estimated 0.5% absolute improvement in cell efficiency. Five such doublings are possible in principle before reaching the intrinsic limit on this parameter imposed by Auger recombination. The best available estimate of this limit for the present resistivity is 1 ms.

Although the invention has been described above with reference to drawings, examples and to preferred embodiments, it will be appreciated that numerous variations, modifications or alternatives may be substituted for specifically described features, without departing from the spirit or scope of the invention as broadly described.

What we claim is:

1. A method of manufacturing a solar cell comprising the steps of forming a layer of semiconductor containing a dopant of one conductivity type on a semiconductor layer containing a dopant of the opposite conductivity type to provide a junction therebetween, depositing a bottom metal contact layer on one of said semiconductor layers, forming a thin insulating layer on the other said semiconductor layer, forming a photosensitive layer on top of said insulating layer, masking the photosensitive layer to define the areas intended for contact between the top metal contact and the other said semiconductor layer, exposing the masked photosensitive layer to light to define the areas intended for contact between the top metal contact and the other said semiconductor layer, removing the photosensitive layer and the insulating layer from areas defined for contact between the top metal contact and the other said semiconductor layer, depositing a top metal contact layer in said areas followed by removal of excess metal deposited onto the insulating layer or photoresist layer, and depositing additional metal on top of the remaining metal to the thickness required to cause adjacent metal regions to join together in desired locations.

2. A method of manufacturing a solar cell comprising the steps of forming a layer of semiconductor containing a dopant of one conductivity type on a semiconductor layer containing a dopant of the opposite conductivity type to form a junction therebetween, forming a thin insulating layer on top of the formed layer of semiconductor, forming holes or slots in said insulating layer in areas defined for contact between the top metal contact and said formed layer of semiconductor, depositing a top metal contact adhering within such defined areas, depositing a rear metal contact on the bottom of said layer of opposite conductivity type, and depositing additional metal on top of the said metal within such defined areas to the thickness required to cause adjacent metal/regions to join together in desired locations.

3. A method of manufacturing a solar cell comprising the steps of forming a layer of semiconductor containing a dopant of one conductivity type on a semiconductor layer containing a dopant of the opposite conductivity type to provide a junction therebetween, depositing a bottom metal contact layer on one of said semiconductor layers, forming a thin insulating layer on the other said semiconductor layer, forming a photosensitive layer on top of said insulating layer, masking the photosensitive layer according to the required surface pattern design of the cell, exposing the masked photosensitive layer to light, forming a layer of antireflection material on top of said photosensitive layer, forming a temporary coating of a suitable material over the antireflection layer, removing the temporary coating and the antireflection material from areas overlying the patterned photosensitive layer, depositing a top metal contact layer in said areas and allowing said top metal contact layer to make contact with the other said semiconductor layer through said thin insulating layer, removing the remaining temporary coating and any excess metal deposited thereon, and depositing additional metal on top of the remaining metal to the thickness required to cause adjacent metal regions to join together in desired locations.

4. A method of manufacturing a solar cell comprising the steps of forming a layer of semiconductor containing a dopant of one conductivity type on a semiconductor layer containing a dopant of the opposite conductivity type to provide a junction therebetween, depositing a bottom metal contact layer on one of said semiconductor layers, forming a thin insulating layer on the other said semiconductor layer, forming a layer of an etchable antireflection material on said insulating layer, masking the antireflection layer to define the areas intended for contact between the top metal contact and the other said semiconductor layer, removing by etching the antireflection layer but not the insulating layer from the areas defined for contact between the top metal contact and the other said semiconductor layer, depositing a top metal contact layer in said areas followed by removal of excess metal deposited onto the antireflection layer, and depositing additional metal on top of the remaining metal to the thickness required to cause adjacent metal regions to join together in desired locations.

5. A method of manufacturing a solar cell comprising a body of semiconductor material having top and bottom metal contact layers, said body having two regions of different conductivity type forming a junction therebetween, one of said regions being a lower region containing a dopant of one conductivity type in contact with the bottom metal contact layer and the other of said regions being an upper region containing a dopant of the opposite conductivity type to that of said lower region, said upper region being separated from said top metal contact layer by a thin insulating layer except for areas where there are holes in the thin insulating layer, said holes defining regions of contact between said upper region and said top metal contact layer, said method comprising the steps of forming a thin insulating layer on said upper region, forming a plurality of holes or slots in said insulating layer to define said regions of contact, depositing metal directly onto said upper region of the body of semiconductor material to form contact pads in the contact regions defined by said holes, and subsequently building up said contact pads by the deposition of metal adhering only in the region of said holes, whereby the metal contact pads are built up to a thickness sufficient to cause them to overlap the insulating layer between said holes, and whereby said top metal contact provides a large cross-sectional area of metallic contact on the top surface of the cell relative to the limited area of direct contact between the top metal contact and the body of semiconductor material.

6. The method of manufacturing a solar cell according to claim 5, wherein the step of building up the contact pads is continued until adjacent contact pads join together at desired locations.

7. The method of manufacturing a solar cell according to claim 5, wherein the lower region of said body is doped with a P-type impurity and said upper region is doped with an N-type impurity.

8. The method of manufacturing a solar cell according to claim 5, wherein the lower region of said body is doped with an N-type impurity and said upper region is doped with a P-type impurity.

9. The method of manufacturing a solar cell according to claim 5, wherein the lateral extent of said bottom metal contact is defined by holes in a thin insulating layer separating the bottom metal contact from said lower region of the body of semiconductor material, whereby the bottom metal contact provides a large cross-sectional area of metallic contact on the bottom surface of the cell relative to the limited area of direct contact between the bottom metal contact and the body of semi-conductor material.

10. The method of manufacturing a solar cell according to claim 5, wherein said regions of differing conductivity type and the metal contacts thereto both lie interleaved on the same side of said body of semiconductor material.

11. The method of manufacturing a solar cell according to claim 5, wherein said metal contact layers are comprised of one or more metals selected from the group consisting of Ag, Al, Ca, Cu, Hf, In, Mg, Mn, Ni, Pb, Pd, Sc, Sn, Ti, Y, and Zr.

* * * * *